United States Patent
Wang et al.

(10) Patent No.: US 7,796,463 B2
(45) Date of Patent: Sep. 14, 2010

(54) SELF-FEEDBACK CONTROL PIPELINE ARCHITECTURE FOR MEMORY READ PATH APPLICATIONS

(75) Inventors: Ming Hung Wang, Hsinchu (TW); Jeng-Tzong Shih, Hsinchu (TW)

(73) Assignee: Etron Technology, Inc., Hsin Chu (TW)

( * ) Notice: Subject to any disclaimer, the term of this patent is extended or adjusted under 35 U.S.C. 154(b) by 105 days.

(21) Appl. No.: 12/157,684

(22) Filed: Jun. 12, 2008

(65) Prior Publication Data

US 2008/0285363 A1 Nov. 20, 2008

Related U.S. Application Data

(62) Division of application No. 11/325,665, filed on Jan. 4, 2006, now Pat. No. 7,359,265.

(51) Int. Cl.
*G11C 8/00* (2006.01)

(52) U.S. Cl. .................. 365/233; 365/194; 365/189.05

(58) Field of Classification Search ................. 365/233, 365/194, 189.05, 189.12, 189.09, 205, 230.06, 365/208, 191

See application file for complete search history.

(56) References Cited

U.S. PATENT DOCUMENTS 5,959,900 A 9/1999 Matsubara

| | | | |
|---|---|---|---|
| 6,452,865 B1 | 9/2002 | Wolford | |
| 6,539,454 B2 | 3/2003 | Mes | |
| 7,065,001 B2* | 6/2006 | Johnson et al. | 365/189.15 |
| 2007/0047340 A1* | 3/2007 | Kim | 365/194 |
| 2007/0201282 A1* | 8/2007 | Nakano | 365/189.09 |

OTHER PUBLICATIONS

1993 IEEE International Solid-State Circuits Conference /Session 16/ Static Memories/ Paper FA 16.4, "A 9ns 16Mb CMOS SRAM with Offest Reduced Current Sense Amplifier," pp. 248-249, 297.

\* cited by examiner

*Primary Examiner*—Dang T Nguyen
(74) *Attorney, Agent, or Firm*—Saile Ackerman LLC; Stephen B. Ackerman; Billy Knowles

(57) ABSTRACT

A memory reading apparatus transfers digital data from a memory array that is independent of external clocking rate, where the data transmission time is not limited by the external clock period, and the internal timing of controls permits flexible column selection and no conflicts in the timing between external clock signals and internal bit line sensing ready signal. The memory read apparatus has a data read path circuit and a memory read control apparatus. The data read path circuit is in communication with the memory to acquire the selected data read from the memory, synchronize the selected data, and transfer the selected data from the memory. The memory read control apparatus is in communications with the data read path circuit for selecting the data to be read from the memory, for providing self-feedback signals for synchronizing the selected data for transfer from the memory.

10 Claims, 4 Drawing Sheets

FIG. 1 – Prior Art

SELF-FEEDBACK CONTROL PIPELINE ARCHITECTURE FOR MEMORY READ PATH APPLICATIONS

This is a divisional application of U.S. patent application Ser. No. 11/325,665 filed on Jan. 4, 2006, now U.S. Pat. No. 7,359,265, which is herein incorporated by reference in its entirety, and assigned to a common assignee.

BACKGROUND OF THE INVENTION

1. Field of the Invention

This invention relates generally to an electronic memory devices. More particularly, this invention relates to circuits for the extraction or reading of digital data from an electronic memory.

2. Description of Related Art

In present electronic memory devices an address is decoded into row addresses and column addresses. The row addresses activates word lines of a row within an array of memory cells. All the memory cells of the row are activated and the digital data is transferred through bit line connection to sense amplifiers for recovery. The column address are used to activate bit line switches for selecting which column is to transfer its recovered data to a data line sense amplifier for further conditioning and amplification. The output of the data line sense amplifier is applied to a data line latch for synchronization with an external clock. The output of the data line latch is transferred to a data output latch for transfer through an output driver circuit to external circuitry.

This read path is structured as a three layer pipeline. The first stage is from the word line access to the bit line switch selection. The second stage is the data line sense amplifier to the data line sense amplifier latch and the third stage is the data output latch.

The latency of an access of data is determined by the time from the presentation of an address to the presence of the data at the output of the driver circuit. The structure of the second pipeline stage allows for shortening of the stage to improve the data access. If the pipeline stages (especially the second pipeline stage) are not shortened then the minimum latency is determined by the long cycle applications where data for different word lines are accessed sequentially. However, if the pipeline stages are shortened then the data transmission time form the bit line sense to the data output latch at the third pipe line stage is limited by the maximum external clock rate.

Refer now to FIG. 1 for a more detailed discussion of a read data path of the prior art. Memory cells 5 are arranged in rows and columns to form the sub-arrays 10a, ..., 10n. An address is decoded to form the word line addresses 15 and the bit line addresses 45 for selecting the desired rows and columns of the memory sub-array 10a, ..., 10n. Each of the memory cells 5 of a selected word line 15 is activated and the digital data is transferred to the bit lines (BL00, ..., BLmn). The bit line sense amplifiers 22a, ..., 22n acquire, amplify, and condition the digital data. The bit line switches 32a, ..., 32n are connected to the terminal ends of the bit lines BL00, $\overline{BL00}$, ..., BLmn, $\overline{BLmn}$ to receive the digital data from the bit line sense amplifiers 22a, ..., 22n. Each of the bit line switches 32a, ..., 32n are formed of a pair of metal oxide semiconductor (MOS) transistors (M1 and M2). The gates of the MOS transistors (M1 and M2) are connected to receive the bit line selection signals BS 55 from the column decoder 50. The column decoder is connected to the column decode control circuit 40, which receives a bit line sense amplifier ready signal 35 indicating the digital data present on the bit lines BL00, $\overline{BL00}$, ..., BLmn, $\overline{BLmn}$ has been sense, amplified, and conditioned for transfer from the memory array 25. The column address 45 is decoded and one of the desired bit line switch 32a, ..., 32n is activated to transfer the digital data from the memory array 25 through the bit line switches 32a, ..., 32n to the data line sense amplifier 60. The data line sense amplifier 60 further amplifies and conditions the digital data. The output of the data line sense amplifier 60 is connected to the input of the data line sense amplifier latch 65. The data lines sense amplifier 65 is a data storage element used to synchronize the digital data with an external clock for transfer to external circuitry.

The output of the data line sense amplifier 60 is transferred to the input of the data output latch 70. The data output latch 70 is a second data storage element used to retain the digital data during transfer of the digital data through an off chip driver 75 to a data output terminal DQ 80 and to external circuitry.

The bit line switches 32a, ..., 32n form the boundary 30 of the first pipeline stage. The data line sense amplifier latch 65 forms the boundary of the second pipeline stage and the data output latch forms the boundary of the third pipeline stage. As noted above, the second pipeline stage can be shortened to minimize the latency of the first access of the digital data from the memory. Thus the performance of the memory system is limited by this first access. If the pipeline transmission time is reduced, then the performance of the memory system is determined by the maximum clock frequency that determines the minimum transmission time from the bit line sense amplifiers 22a, ..., 22n to the output terminal DQ 80.

"A 9 Ns 16 Mb CMOS SRAM with Offset Reduced Current Sense Amplifier." Seno, et al., Digest of Technical Papers: 40th ISSCC IEEE International Solid-State Circuits Conference, 1993, pp.: 248-249, 297 describes a 4-Mb×4 SRAM (static random access memory) with a current-mode nonequalized read data path. The read data path has an offset-reduced stabilized-feedback current sense amplifier and a quadrant-organization architecture.

U.S. Pat. No. 5,959,900 (Matsubara) illustrates a synchronous semiconductor memory having a register with an input gate and an output gate, for holding read-out data between the input gate and the output gate. An input gate control circuit controls an open/close of the input gate with a output switch feedback signal in the form of a one-shot pulse generated by an output gate control circuit for controlling an open/close of the output gate. The open/close, in synchronism with an output gate switch signal, so that only after the data held in the register has been transferred to an external of the register, the next data to be successively transferred from the read/write bus to the register is actually latched in the register.

U.S. Pat. No. 6,452,865 (Wolford) provides a single common symmetrical double data rate (DDR) synchronous random access memory (SDRAM) read data path structure and corresponding storage addressing scheme. The read data path structure implements both an N-bit interface and an (N/2)-bit interface to the DDR memory. The read data path structure uses a feedback loop of a lower data path to a higher data path in conjunction with the translation of the physical addressing of the data stored into a memory. The feedback loop and address translation mechanism is enabled for (N/2)-bit mode and disabled for N-bit mode.

U.S. Pat. No. 6,539,454 (Mes) describes an asynchronously pipelined SDRAM. The asynchronously pipelined SDRAM has separate pipeline stages that are controlled by asynchronous signals to synchronize data at each stage, an asynchronous signal is used to latch data at every stage. The asynchronous control signals are generated within the chip and are optimized to the different latency stages. The data is synchronized to the clock at the end of the read data path before being read out of the chip.

SUMMARY OF THE INVENTION

An object of this invention is to provide a data reading apparatus for transferring digital data from a memory array that is independent of external clocking rate.

Another object of this invention is to provide a data reading apparatus for transferring digital data from a memory array where the data transmission time is not limited by the external clock period.

Another object of this invention is to provide a data reading apparatus of transferring digital data from a memory array such that internal timing of controls permits flexible column selection and no conflicts in the timing between external clock signals and internal bit line sensing ready signals.

To accomplish at least one of these objects, a memory read apparatus within a memory system is in communication with an array of memory cells for transferring selected data read from the memory. The memory read apparatus has a data read path circuit and a memory read control apparatus. The data read path circuit is in communication with the memory to acquire the selected data read from the memory, synchronize the selected data, and transfer the selected data from the memory. The memory read control apparatus is in communications with the data read path circuit for selecting the data to be read from the memory, for providing self-feedback signals for synchronizing the selected data for transfer from the memory.

The data read path includes a plurality of bit line switches in communication with bit line sense amplifiers within the array of memory cells for selectively transferring the data from selected memory cells. A data line sense amplifier in communication with the plurality of bit line switches to receive the data from the selected memory cell. A data line sense amplifier latch is in communication with data line sense amplifier to acquire the data for synchronization and a data output latch is in communication with the data line sense amplifier latch to synchronously transfer the data from the memory.

The memory read control apparatus has a data output latch control circuit receiving an external timing signal to provide a timing signal to the data output latch for synchronization of the transferring of the selected data from the memory. A sense amplifier latch control circuit is in communication with the data output latch control circuit to receive a sense amplifier latch clear signal to provide a sense amplifier latch control signal to the data line sense amplifier latch to synchronize the selected data read from the memory comprising. A sense amplifier control circuit is in communication with the data line sense amplifier to provide a data line sense amplifier enabling signal to the data line sense amplifier and with the sense amplifier control circuit to provide a sense amplifier enable signal to the sense amplifier latch control circuit and receive the sense amplifier latch signal from the sense amplifier latch control circuit to indicate that the data line sense amplifier is to be disabled.

The memory read path apparatus further has a column control circuit in communication with the sense amplifier control circuit to receive a read synchronization signal. The column control circuit is further in communication with the memory to receive a bit line sense ready signal to generate a bit line switch enable signal, and with a column address decoder with the memory to provide a bit line switch activation signal for selecting a desired data for transfer from the memory.

The memory array may be such memories as a pseudo-static random access memory, static random access memory, read only memory, or dynamic random access memory.

DETAILED DESCRIPTION OF THE INVENTION

The data read path circuitry within a memory system of this invention controls and synchronizes a memory read operation for transferring selected data read from the memory. The data read path circuitry receives an external timing or clock signal and generates a data output latch timing signal from the external timing signal. The data output latch timing signal is transferred to a data output latch for synchronization of the transferring of the selected data from the memory. The external timing or clock signal is used to generate a sense amplifier latch clear signal that is then combined with a senses amplifier enable signal to produce the sense amplifier latch control signal. The sense amplifier latch control signal is then transferred to a sense amplifier latch of the memory to gate the selected data read from the memory.

A column decode circuit receive a column address, decodes the address to generate the bit switch activation signals to activate bit switches of each column of the array of memory cells to select one of the outputs of the bit line sense amplifiers to a data line sense amplifier. The bit switch enable signal is used to generate a data line sense amplifier enable signal. The sense amplifier latch control signal is used to stop the data line sense amplifier enable signal to deactivate the data line sense amplifier.

A read synchronization signal generated from a combination of the bit line switch enable signal and the sense amplifier latch control signal. A bit line sensing ready signal is received from the array of memory cells when the bit lines have been retrieved by the sense amplifiers. The read synchronization signal and bit line sensing ready signal are combined to generate one of the bit switch activation signals for selecting a desired data for transfer from the memory.

Figure 1:
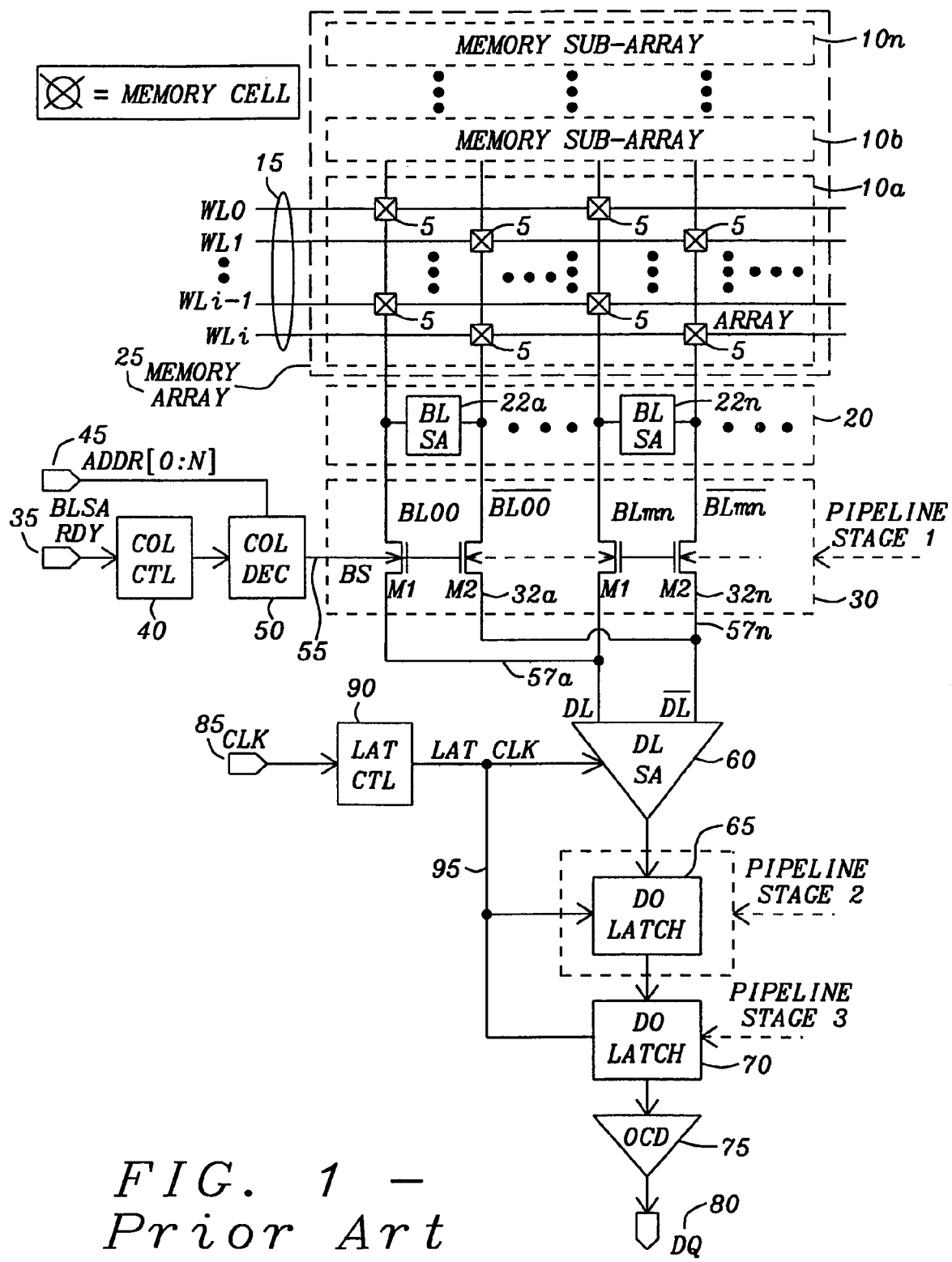
FIG. 1 is a schematic diagram of a memory device illustrating the data read path circuitry of the prior art.
Figure 2:
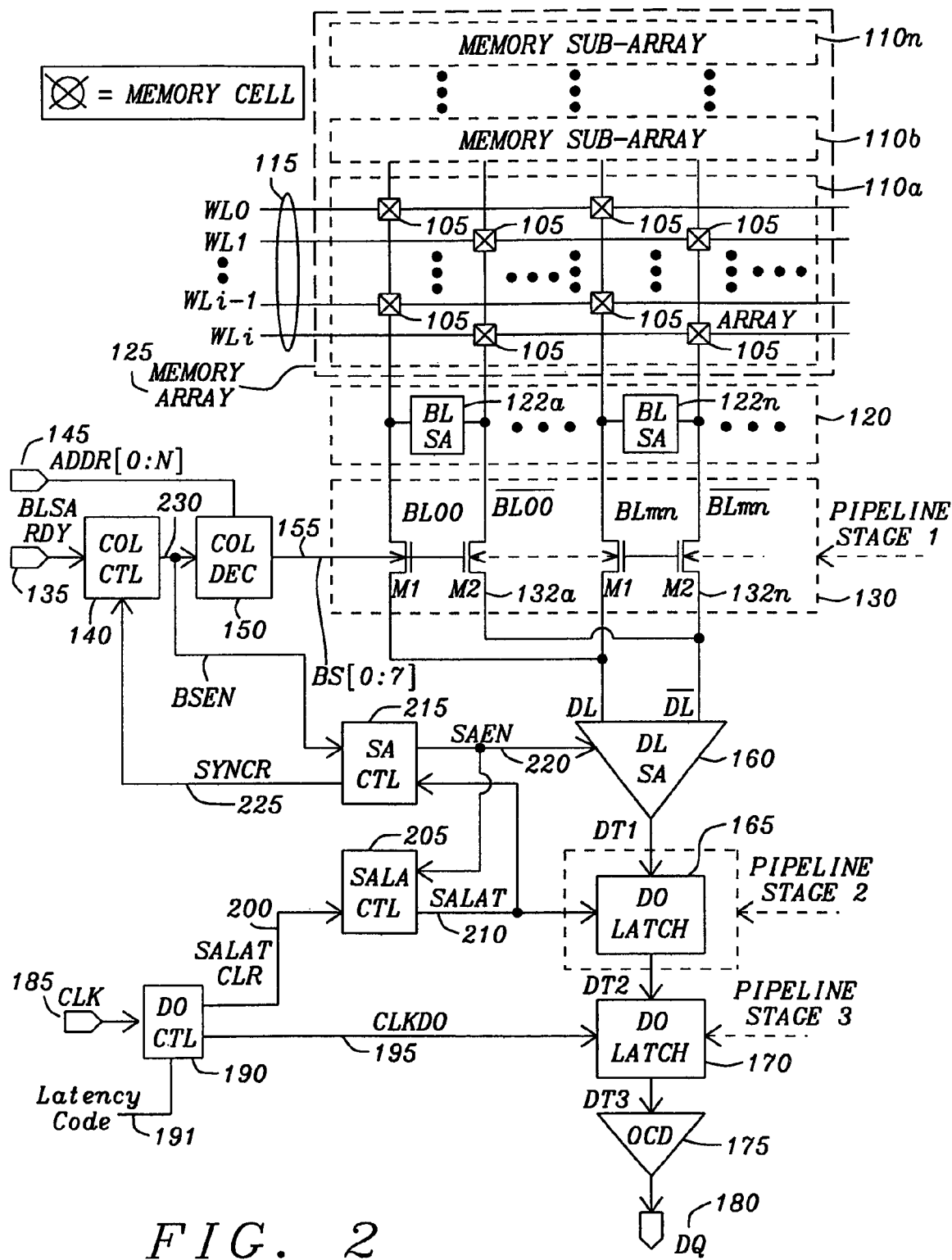
FIG. 2 is a schematic diagram of a memory device illustrating the data read path circuitry of this invention.

Refer now to FIG. 2 for a more detailed discussion of a read data path of a memory device of this invention. In a structure similar to those of FIG. 1, the memory cells 105 are arranged in row and columns to form the sub-arrays 110a, . . . , 110n. An address is decoded to form the word line addresses 115 and the bit line addresses 145 for selecting the desired rows and columns of the memory sub-array 110a, . . . , 110n. Each of the memory cells 105 of a selected word line 115 is activated and the digital data is transferred to the bit lines (BL00, $\overline{BL00}$, . . . , BLmn, $\overline{BLmn}$). The bit line sense amplifiers 122a, . . . , 122n acquire, amplify, and condition the digital data. The bit line switches 132a, . . . , 132n are connected to the terminal ends of the bit lines BL00, $\overline{BL00}$, . . . , BLmn, $\overline{BLmn}$ to receive the digital data from the bit line sense amplifiers 122a, . . . , 122n. Each of the bit line switches 132a, . . . , 132n are formed of a pair of metal oxide semiconductor (MOS) transistors (M1 and M2). The gates of the MOS transistors (M1 and M2) are connected to receive the bit line selection signals BS 155 from the column decoder 150. The column decoder is connected to the column control circuit 140, which receives a bit line sensing ready signal 135 indicating the digital data present on the bit lines BL00, $\overline{\text{BL00}}$, . . . , BLmn, $\overline{\text{BLmn}}$ has been sensed, amplified, and conditioned for transfer from the memory array 125. The column address 145 is decoded and the desired bit line switch 132$a$, . . . , 132$n$ is activated to transfer the digital data from the memory array 125 through the bit line switches 132$a$, . . . , 132$n$ to the data line sense amplifier 160. The data line sense amplifier 160 further amplifies and conditions the digital data.

The output of the data line sense amplifier 160 is connected to the input of the data line sense amplifier latch 165. The data lines sense amplifier latch 165 is a data storage element used to synchronize the digital data with an external clock for transfer to external circuitry.

The output of the data line sense amplifier latch 165 is transferred to the input of the data output latch 170. The data output latch 170 is a second data storage element used to retain the digital data during transfer of the digital data through an off chip driver 175 to a data output terminal DQ 180 and to external circuitry.

The bit line switches 132$a$, . . . , 132$n$ form the boundary 130 of the first pipeline stage. The data line sense amplifier latch 165 forms the boundary of the second pipeline stage and the data output latch forms the boundary of the third pipeline stage. The external clock 185 is applied to a data output control circuit 190 to generate the data output latch timing signal 195 to control the activation of the data output latch 170 for transfer of the data to the off chip driver 175 to the data output terminal DQ 180. The data output control circuit 190 further generates a data line sense amplifier latch clear signal 200. The data line sense amplifier latch clear signal 200 and a data line sense amplifier enable signal 220 are combined in the sense amplifier latch control circuit 205 to generate the data line sense amplifier latch control signal 210.

The data line sense amplifier latch control signal 210 is transferred to the data line sense amplifier control circuit 215. The data line sense amplifier latch control signal 210 is combined with the bit line switch activation signals 155 to generate the data line sense amplifier enable signal 220. The data line sense amplifier latch control signal 210 is further combined with the bit line switch enable signal 230 to generate the read synchronization signal 225 that is applied to the column control circuit 140.

The bit line sensing ready signal 135 is an input to the column control circuit 140 and is combined with the read synchronization signal 225 to generate the bit line switch enable signal 230. The bit line switch enable signal is combined with the bit line addresses 145 to activate the appropriate bit switch activation signal 155 at its appropriate time.

Figure 3:
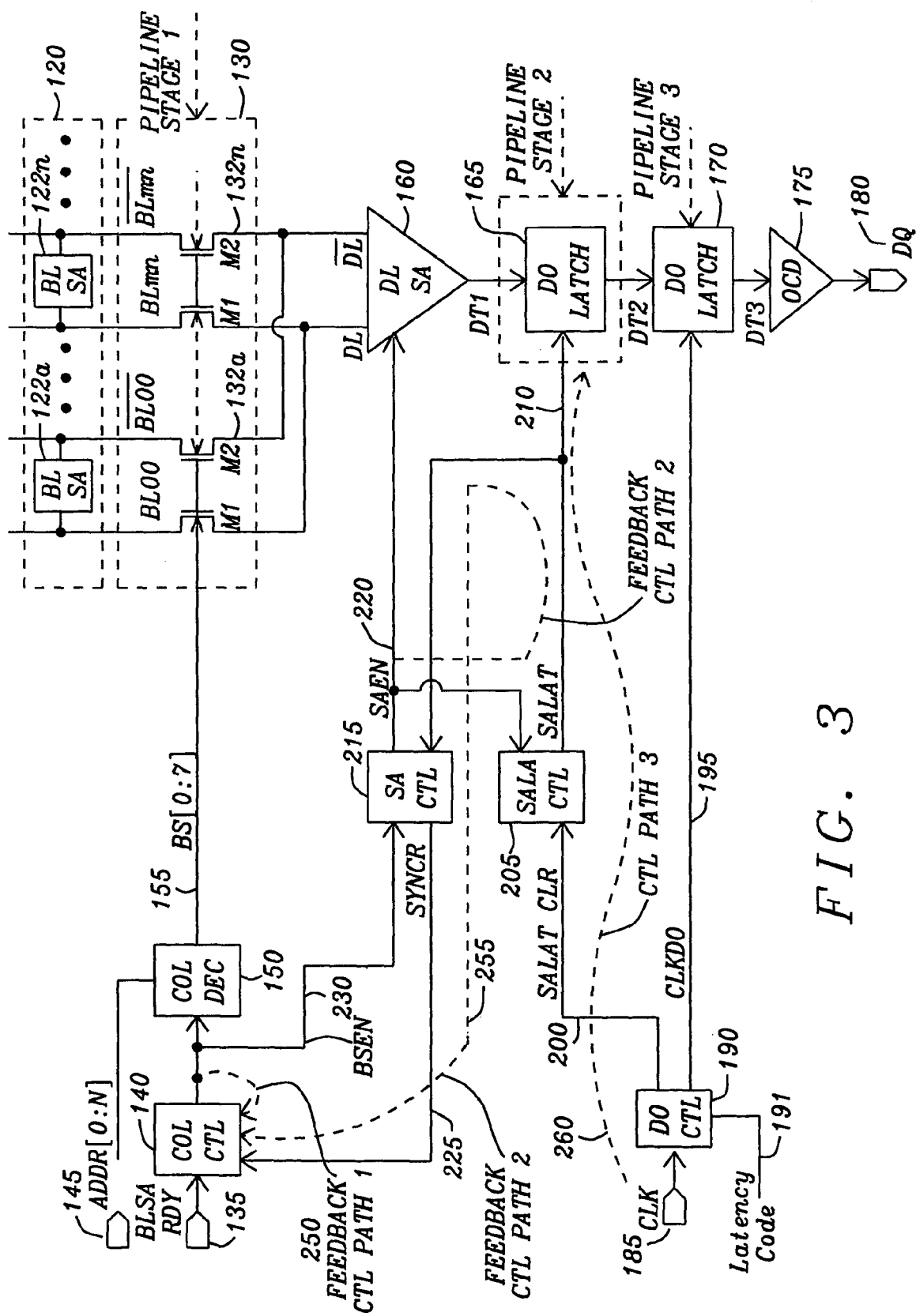
FIG. 3 is a schematic diagram of a memory device illustrating the data read path circuitry of this invention highlighting the self-feedback control paths.

FIG. 3 shows the data read path structure of the memory device of this invention and highlights the self-feedback control paths of the pipeline of the data read path. The first feedback control path 250 synchronizes the bit line switch enable signals 155 such that they are activated based ultimately on the external clock 185 and the bit line sensing ready signal 135. The second feedback control path 255 provides the timing for the data line sense amplifier enable signal 220 and the data line sense amplifier latch control signal 210. The basic control path (control path 3) 260 provides the timing for the third pipeline stage. When the current data present DT2 at the data line sense amplifier latch 165 is latched to the data output latch 170, the data line sense amplifier latch 165 can be release and made ready for the next data DT1 from the data line sense amplifier 160.

Figure 4:
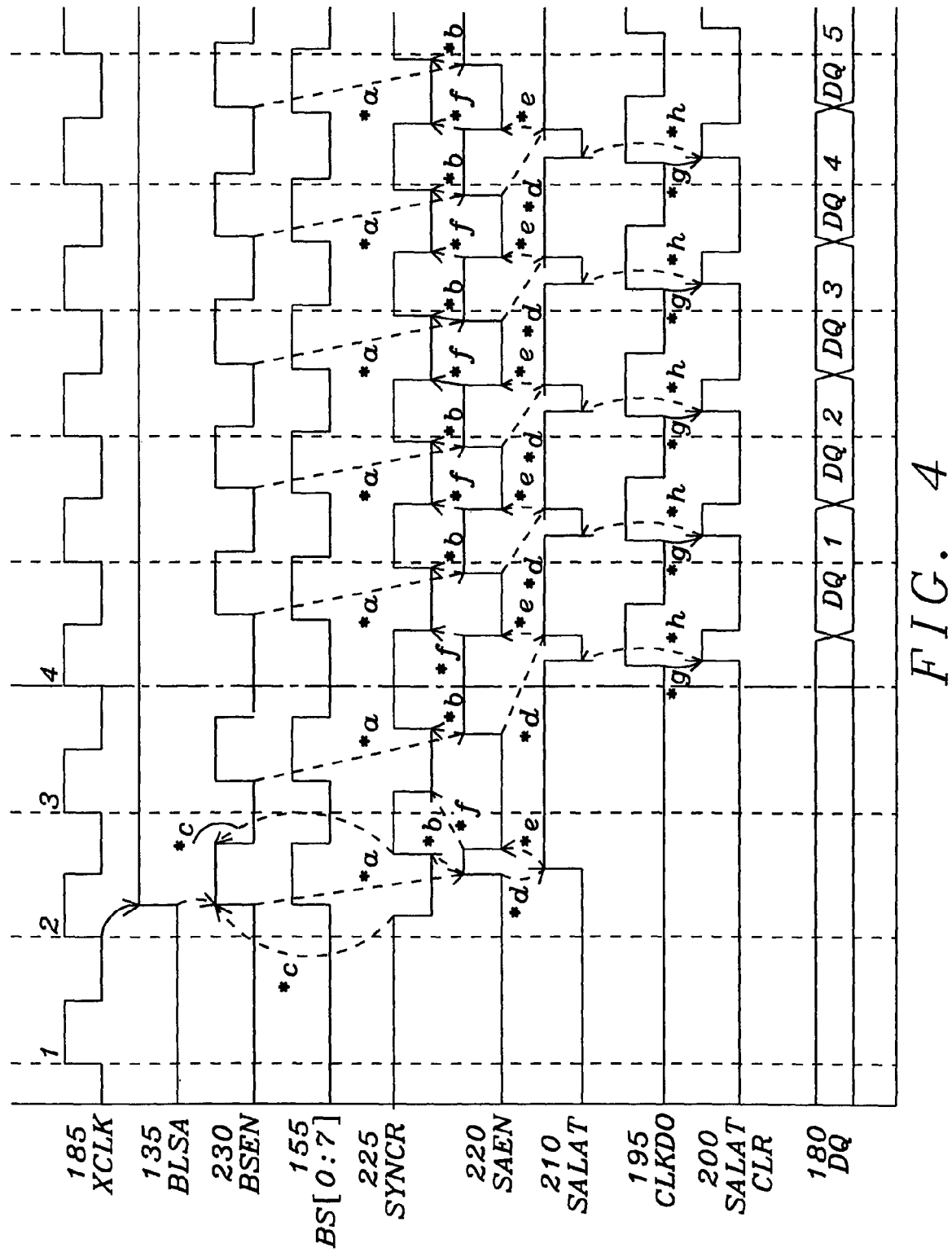
FIG. 4 is a timing diagram of the operation of the memory device with the data read path circuitry of this invention.

Refer now to FIG. 4 for a discussion of the function of the first feedback control path 250, second feedback control path 255, and the basic control path 260. The bit line sensing ready signal 135 is brought to an active state at a time after one of the transitions of the external clock 185, as determined by the latency of the access of the memory array. The bit switch enable signal 230 is activated based on the transition of the bit line sensing ready signal 135 which in turn acts to activate one of the selected the bit line switch activation signals 155 to turn on one of the bit line switches 132$a$, . . . , 132$n$ of FIGS. 2-3. The first feedback control path 250 of FIG. 3 provides the control of the active interval time for the bit line switches 32$a$, . . . , 32$n$ to transfer the selected digital data to the data line sense amplifier 160 of FIGS. 2-3. The first segment (*a) of the feedback control path 250 activates the data line sense amplifier enable signal 220 for the transfer of the selected data signals to the data line sense amplifier 160. The duration of the first segment (*a) tracks the time taken for the data line sense amplifier 160 to develop the digital data DT1 at its output. This determines the amount of time that the data line sense amplifier enable signal 220 is active after the selected bit line switches 132$a$, . . . , 132$n$ is activated to effectively connect the selected bit line BL00, $\overline{\text{BL00}}$, . . . , BLmn, $\overline{\text{BLmn}}$ to the data line sense amplifier 160. The second segment (*b) and the third segment (*c) determines the time at which the read synchronization signal 225 is activated and from the read synchronization signal 225, the bit line switch enable signal 230 and thus the bit line switches 132$a$, . . . , 132$n$ are deactivated as quickly as possible.

The second feedback control path 255 begins with the data line sense amplifier enable signal 220 determine the time at which the data line sense amplifier latch control signal 210 is activated to capture the data into the data line sense amplifier latch 165 of FIGS. 2-3 during the first segment (*d). In the prior art, the data line sense amplifier 60 of FIG. 1 was deactivated or reset by the external clock 85. This forces the data at the output of the data line sense amplifier latch 65 to be held until it the data output latch 70 is activated or set.

The data line sense amplifier latch control signal 210 determines the time at which the data line sense amplifier enable signal 220 is deactivated to disable the data lines sense amplifier 160 during the second segment (*e). This in turn determines the time at which the next read cycle is initiated. In the third segment (*f), the read synchronization signal 225 is set to a level which allows the bit line switch enable signal 230 to be activated and the next bit line switch 132$a$, 132$n$ to be activated again.

The third pipeline includes the segments *g and *h to control the capturing of the digital data DT2 in the data line sense amplifier latch 165 and the reset or release of the data line sense amplifier latch 165. In the segment *g, the external clock triggers the data line sense amplifier latch clear signal 200.

The data output latch timing signal 195 is adjusted by the data output control circuit 190 to account for the memory latency. The mode register code 191 provides a user defined code that adjust the latency cycles of the data output latch timing signal 195.

The data line sense amplifier latch clear signal 200 then determines the time for the deactivation or reset of the data line sense amplifier latch 165. This permits the acquisition of the next data DT2 by the data line sense amplifier latch 165.

The self-feedback structure of the read data path control circuitry of this invention provides an internal timing margin that is independent of the frequency of the external clock 185. Further, the structure provides a relatively simple solution that is easily implemented in an integrated circuit. This provides more flexibility relative to that of the prior art where the data transit time for each stage is limited by the period of the external clock 185.

This structure is suitable for static random access memory, read only memory, or dynamic random access memory. However, this structure is particularly suitable for pseudo-static random access memory because it lacks a clear column read command at each read cycle. This prevents any problems of boundary alignment of the data access where overlap of the external clock 185 and the bit line sensing ready signal 135.

While this invention has been particularly shown and described with reference to the preferred embodiments thereof, it will be understood by those skilled in the art that various changes in form and details may be made without departing from the spirit and scope of the invention.

The invention claimed is:

1. A memory system comprising:
    an array of memory cells for retaining data; and
    a memory read apparatus in communication with said array of memory cells for transferring selected data read from said memory comprising:
        a data read path circuit in communication with said memory to acquire said selected data read from said memory, synchronize said selected data, and transfer said selected data from said memory; and
    a memory read control apparatus in communications with said data read path circuit for selecting said data to be read from said memory, for providing self-feedback signals for synchronizing said selected data for transfer from said memory, said memory read control apparatus comprising:
        a data output latch control circuit receiving an external timing signal to provide a timing signal to said data output latch for synchronization of the transferring of the selected data from said memory;
        a sense amplifier latch control circuit in communication with said data output latch control circuit to receive a sense amplifier latch clear signal which is combined with a data line sense amplifier enable signal to generate a sense amplifier latch control signal that is communicated to said data line sense amplifier latch to synchronize the selected data read from said memory; and
        a sense amplifier control circuit in communication with said sense amplifier latch control circuit to provide said data line sense amplifier enable signal to said sense amplifier latch control circuit and to receive said sense amplifier latch control signal from said sense amplifier latch control circuit and in communication with a data line sense amplifier to provide said data line sense amplifier enabling signal to said data line sense amplifier and to said sense amplifier latch control circuit and receive the sense amplifier latch signal from said sense amplifier latch control circuit to indicate that said data line sense amplifier is to be disabled.

2. The memory system of claim 1 wherein said data read path comprises:
    a plurality of bit line switches in communication with bit line sense amplifiers within said array of memory cells for selectively transferring said data from selected memory cells;
    a data line sense amplifier in communication with said plurality of bit line switches to receive said data from said selected memory cells;
    a data line sense amplifier latch in communication with data line sense amplifier to acquire said data for synchronization; and
    a data output latch in communication with said data line sense amplifier latch to synchronously transfer said data from said memory.

3. The memory system of claim 1 further comprising a column control circuit in communication with said sense amplifier control circuit to receive a read synchronization signal, with the memory to receive a bit line switch ready signal to generate a bit line switch enable signal, and with a column address decoder with the memory to provide a bit line switch enable signal for selecting a desired data for transfer from said memory.

4. The memory system of claim 3 wherein said sense amplifier control circuit receives said bit line switch enable signal from said address control circuit and wherein said bit line switch enable signal is combined with said sense amplifier latch control signal to generate said data line sense amplifier enabling signal.

5. The memory system of claim 1 wherein said memory is selected from the group of memories consisting of pseudo-static random access memory, static random access memory, read only memory, and dynamic random access memory.

6. A memory read path apparatus in communication with an array of memory cells for transferring selected data read from said memory comprising:
    a data read path circuit in communication with said memory to acquire said selected data read from said memory, synchronize said selected data, and transfer said selected data from said memory; and
    a memory read control apparatus in communications with said data read path circuit for selecting said data to be read from said memory, for providing self-feedback signals for synchronizing said selected data for transfer from said memory, said memory read control apparatus comprising:
        a data output latch control circuit receiving an external timing signal to provide a timing signal to said data output latch for synchronization of the transferring of the selected data from said memory;
        a sense amplifier latch control circuit in communication with said data output latch control circuit to receive a sense amplifier latch clear signal which is combined with a data line sense amplifier enable signal to generate a sense amplifier latch control signal that is communicated to said data line sense amplifier latch to synchronize the selected data read from said memory; and
        a sense amplifier control circuit in communication with said sense amplifier latch control circuit to provide said data line sense amplifier enable signal to said sense amplifier latch control circuit and to receive said sense amplifier latch control signal from said sense amplifier latch control circuit and in communication with a data line sense amplifier to provide said data line sense amplifier enabling signal to said data line sense amplifier and to said sense amplifier latch control circuit and receive the sense amplifier latch signal from said sense amplifier latch control circuit to indicate that said data line sense amplifier is to be disabled.

7. The memory read path apparatus claim 6 wherein said data read path comprises:

a plurality of bit line switches in communication with bit line sense amplifiers within said array of memory cells for selectively transferring said data from selected memory cells;

a data line sense amplifier in communication with said plurality of bit line switches to receive said data from said selected memory cells;

a data line sense amplifier latch in communication with data line sense amplifier to acquire said data for synchronization; and a data output latch in communication with said data line sense amplifier latch to synchronously transfer said data from said memory.

8. The memory read path apparatus of claim 7 further comprising a column control circuit in communication with said sense amplifier control circuit to receive a read synchronization signal, with the memory to receive a bit line sensing ready signal to generate a bit line switch enable signal, and with a column address decoder within the memory to provide a bit line switch enable signal for selecting a desired data for transfer from said memory.

9. The memory read path apparatus of claim 8 wherein said sense amplifier control circuit receives said bit line switch enable signal from said address control circuit and wherein said bit line switch enable signal is combined with said sense amplifier latch control signal to generate said data line sense amplifier enabling signal.

10. The memory read path apparatus of claim 7 wherein said memory is selected from the group of memories consisting of pseudo-static random access memory, static random access memory, read only memory, and dynamic random access memory.

* * * * *